United States Patent [19]

Land

[11] 3,986,082

[45] Oct. 12, 1976

[54] UNIVERSAL TEMPERATURE CONTROLLED REFERENCE JUNCTION

[75] Inventor: Ronald E. Land, Monroeville, Pa.

[73] Assignee: The United States of America as represented by the Secretary of the Air Force, Washington, D.C.

[22] Filed: Feb. 14, 1975

[21] Appl. No.: 550,092

[52] U.S. Cl............... 317/120; 317/100; 219/210; 339/273 R; 174/52 PE
[51] Int. Cl.² ............ H05K 7/20; H02B 1/10
[58] Field of Search ............ 317/99, 100, 118, 112, 317/120; 219/209, 210, 505; 339/112, 273; 174/52 PE; 73/341, 361; 136/222

[56] References Cited

UNITED STATES PATENTS

| | | | |
|---|---|---|---|
| 3,244,371 | 4/1966 | Bishop | 219/210 |
| 3,405,381 | 10/1968 | Zandman et al. | 174/52 PE |
| 3,411,049 | 11/1968 | Trincossi et al. | 317/100 |
| 3,449,641 | 6/1969 | Lee | 174/52 PE |
| 3,590,327 | 6/1971 | Thomae | 317/100 |
| 3,668,477 | 6/1972 | Zellmer | 317/100 |
| 3,883,715 | 5/1975 | Gebo | 219/210 |

FOREIGN PATENTS OR APPLICATIONS 2,018,934   11/1971   Germany.................. 339/273 R Primary Examiner—Gerald P. Tolin
Attorney, Agent, or Firm—Joseph E. Rusz; Robert Kern Duncan

[57] ABSTRACT

Junctions of the signal leads from equipment monitoring sensors to conventional cable lines are made by forming reference junctions of the signal leads in shielded temperature controlled oxygen-free hardened copper slugs embedded in a beryllium oxide block. Sensors may readily be changed since the junctions of the signal leads in the copper slugs are made through removable plastic taper pins forming pressure contacts of the leads in recesses formed in the copper slugs. The universal reference junctions are particularly suited for making connections to the leads of sensors which are located in intense electrical fields.

2 Claims, 10 Drawing Figures

UNIVERSAL TEMPERATURE CONTROLLED REFERENCE JUNCTION

RIGHTS OF THE GOVERNMENT

The invention described herein may be manufactured and used by or for the Government of the United States for all governmental purposes without the payment of any royalty.

BACKGROUND OF THE INVENTION

The field of the invention is in the art of physical measuring by electrical sensors in the presence of intense electrical fields.

Reference junctions for thermocouple devices are well known. In these instances, a hot and a cold junction are established and the difference in voltages generated between two dissimilar metals at the junctions provides an indication of the temperature at one junction, usually the hot one, if the voltage generated at the other junction, usually temperature controlled, is known.

In prior conventional attempts to monitor the re-entry effects on materials and objects (such as they would encounter in re-entering the earth's atmosphere from outer space) in an electro-gasdynamic facility in which electrical fields (both static and magnetic) in very close proximity to the monitoring sensors involve discharges ranging from 50 to 100 million watts of electrical power, very erratic and unsatisfactory indications from the monitoring sensors were obtained. The monitoring sensors generally not only included thermocouple temperature sensors but position sensors, strain sensors, erosion sensors, flow sensors, and others. In the test setup it is desirable to be able to easily change sensors. It has been discovered that the electrical connections made to the leads of the sensors frequently become quite erratic and often voltage potential sources in environments of extremely high electrical fields.

SUMMARY OF THE INVENTION

The invention provides apparatus for making electrical line connections in high intensity electrical fields to electrical sensors that are easily changeable and that do not introduce changing or variable electrical characteristics in the connections, thus accurate and reliable electrical readings may be obtained from the sensors.

DESCRIPTION OF THE PREFERRED EMBODIMENT

Figure 1:
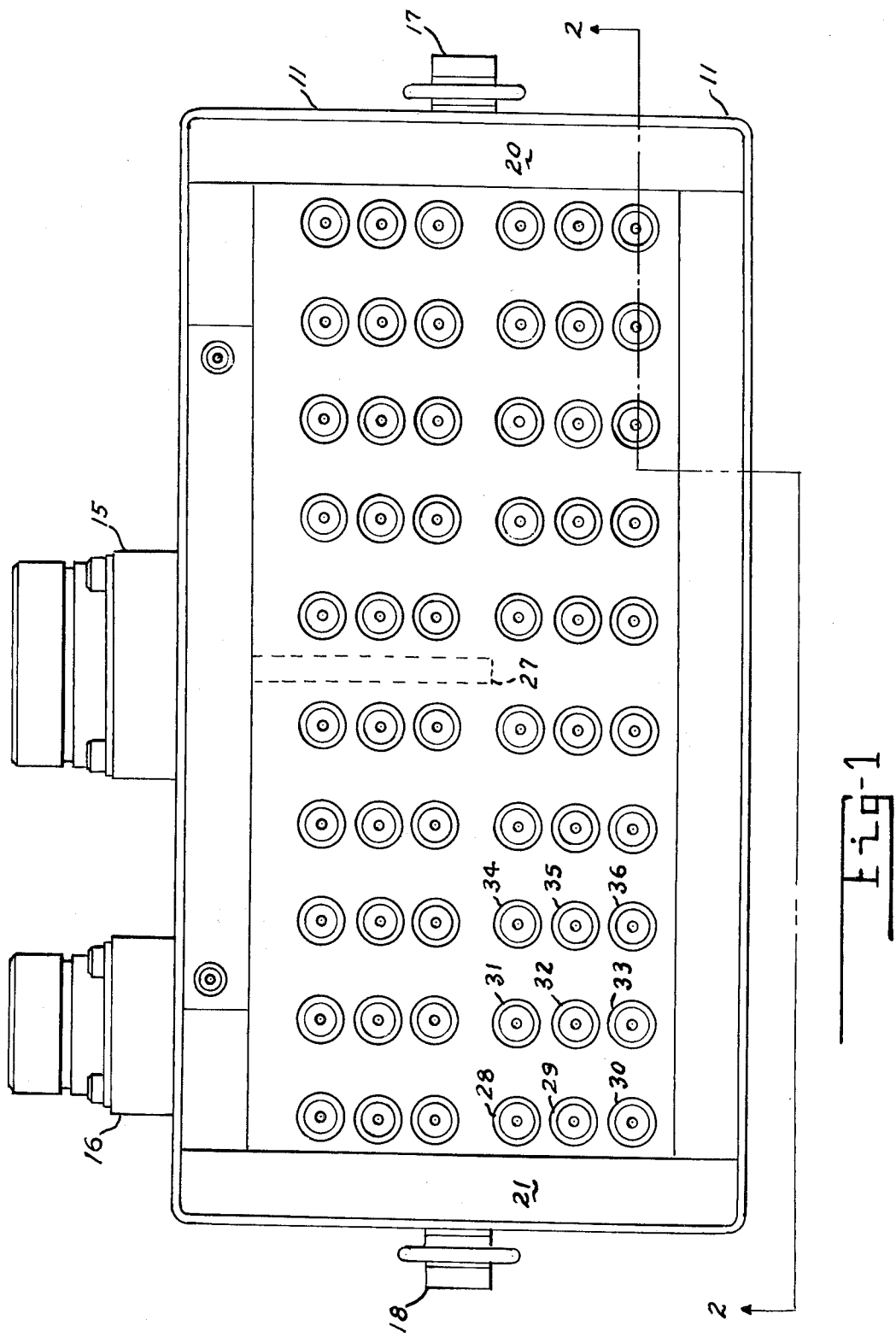
FIG. 1 is a pictorial plan view of a typical twenty-circuit junction box with the cover removed.
Figure 2:
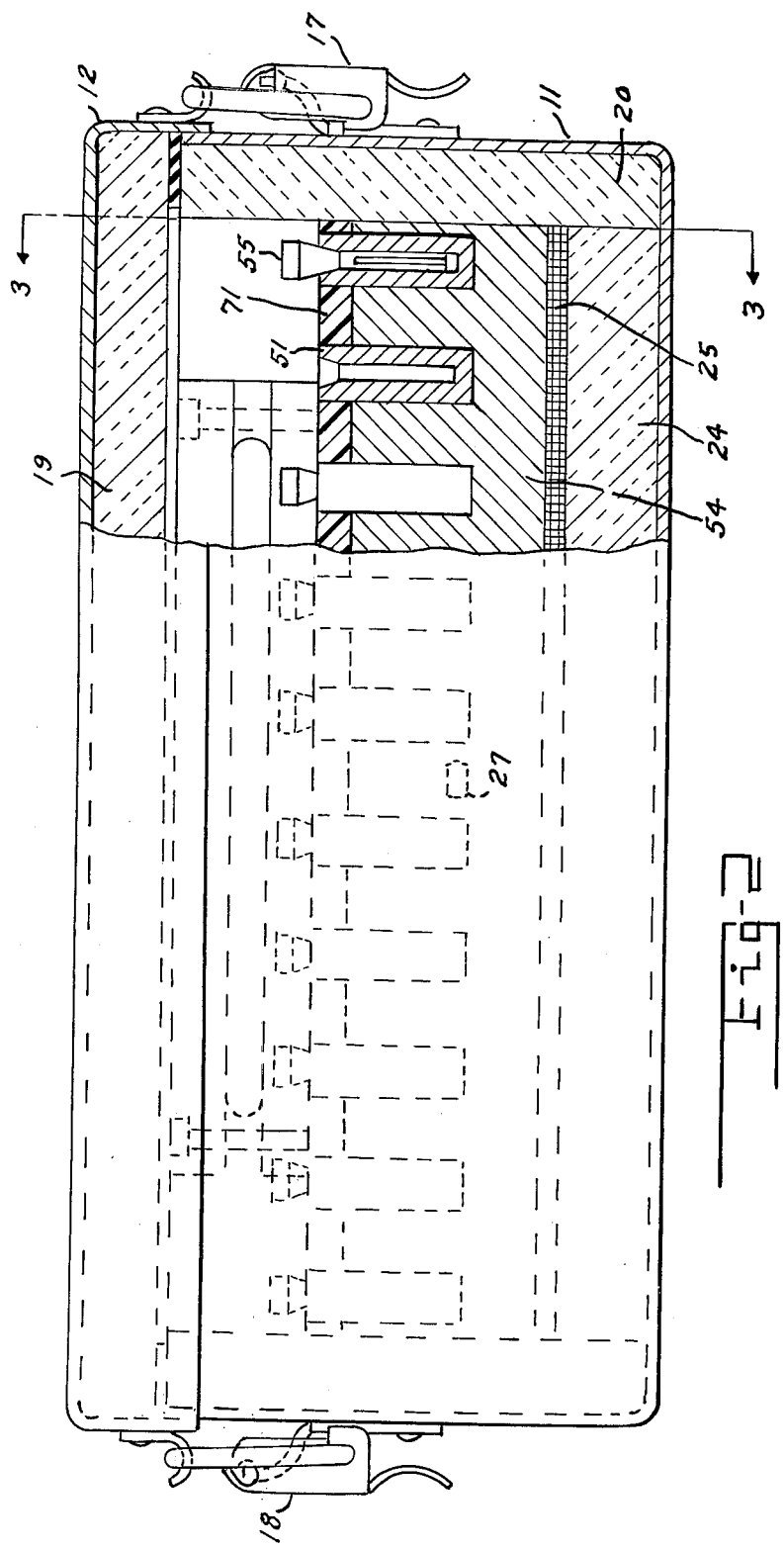
FIG. 2 is a pictorial front elevation view of the complete box of FIG. 1 with a broken-away partial section.
Figure 3:
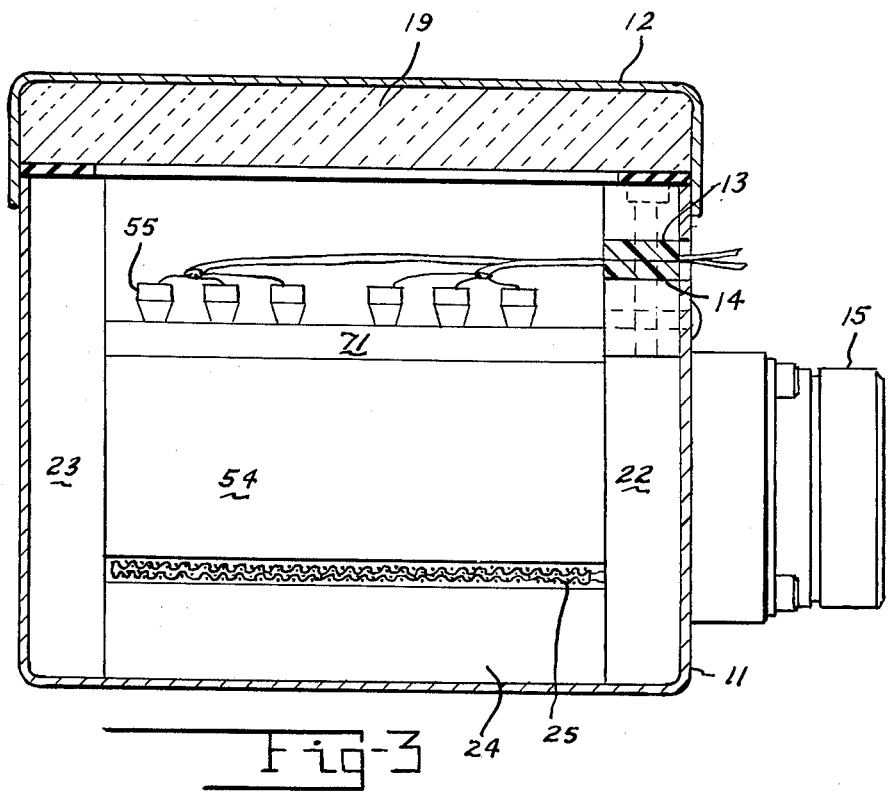
FIG. 3 is a pictorial end elevation section view of the box of FIGS. 1 and 2.

In a typical operating embodiment of the invention a 20-circuit temperature controlled reference junction box as shown in FIGS. 1, 2, and 3 is located within approximately 2 feet of a 50-million watt electrical discharge. It has provided heretofore unobtainable reliable readings from various sensors situated on and in connection with materials located in the discharge. Ideally all signal leads from measuring sensors are connected through such a reference box or boxes. Ideally, also, the leads or wires used going from the sensors to the reference junctions are the electrical conductors used in the sensing device. Thus, the wires from the sensors may be of platinum, tungsten, or other high temperature conductors, or in the case of typical thermocouples they may be typically, chromel-alumel (type K), platinum-rhodium (type S), tungsten-rhenium (type W), or other conventional thermocouple element conductors. The conductors going from the temperature controlled reference junction to the remotely located utilization equipment are conventional shielded copper conductor cables. The construction of the reference junction box provides for all signal lead connections, including the ground leads, to be temperature controlled and uniformly shielded, (both electro-magnetically and electrostatically). The connections thus are effected minimally, if at all, and then if affected, affected in a consistent, reproducible, and uniform manner. In many instances there is a tendency for all effects that may be generated in the leads of a single circuit to cancel each other and leave the resultant signal from the sensor undisturbed.

For illustrative purposes a specific embodiment of the invention will be described in detail. For guidance in practicing the invention specific circuits will be diagrammed, and physical sizes and numbers of sircuits will be enumerated, however, it is to be understood that such are not limiting to the scope of the invention.

Referring to FIGS. 1, 2, and 3 of the drawing, the metallic case 11 and the detachable cover 12 are fabricated from ferrous magnetic material such as iron or steel to provide magnetic shielding and substantially a water tight enclosure. Magnetic stainless steel has been found to be a preferred case material. Water tightness or at least a splash-proof enclosure is required due to the quantities of water utilized for cooling purposes in the vicinity of the enclosure. Sensor lead wires enter the box through the deformable, sealing, strips 13 and 14. With the cover removed, the upper strip 13 may be removed when changing sensors. Conventional plastic or rubber tape may be used for the sealing strips. The output from the box is through the conventional multi-circuit cable connector 15. Connector 16 carries the conductors for the heating element and its control circuit that are contained in the enclosure. Conventional snap fasteners 17 and 18 provide a suitable way to removably attach the cover to the box. The cover, and the sides and bottom of the box are lined with conventional thermal insulating material, 19, 20, 21, 22, 23, and 24 respectively, conventional sheet styrofoam is a suitable material. The electrical heating power flowing into the conventional heating element 25 is controlled, as shown schematically in FIGS. 7 and 8, through a conventional temperature controller 26 and thermistor temperature sensing element 27. The thermistor is positioned substantially at the center of the BeO block as shown in FIGS. 1 and 2. The absolute value of temperature at which the junction box is maintained is not critical. It will be established by those practicing this invention dependent upon the environment in which the box is located. The primary requirement is that it be established at a temperature that can be maintained substantially constant in the environment. The effective accuracy of the measurements made by the sensors connected through the box is dependent, in part, upon the stability and consistency of the temperature of the junctions made within the box. In a typical operational usage of the invention located on the model test carriage of a 50-million watt electrogas-dynamic re-entry test facility, a temperature of 150° ± 0.10° F has been found suitable.

Figure 7:
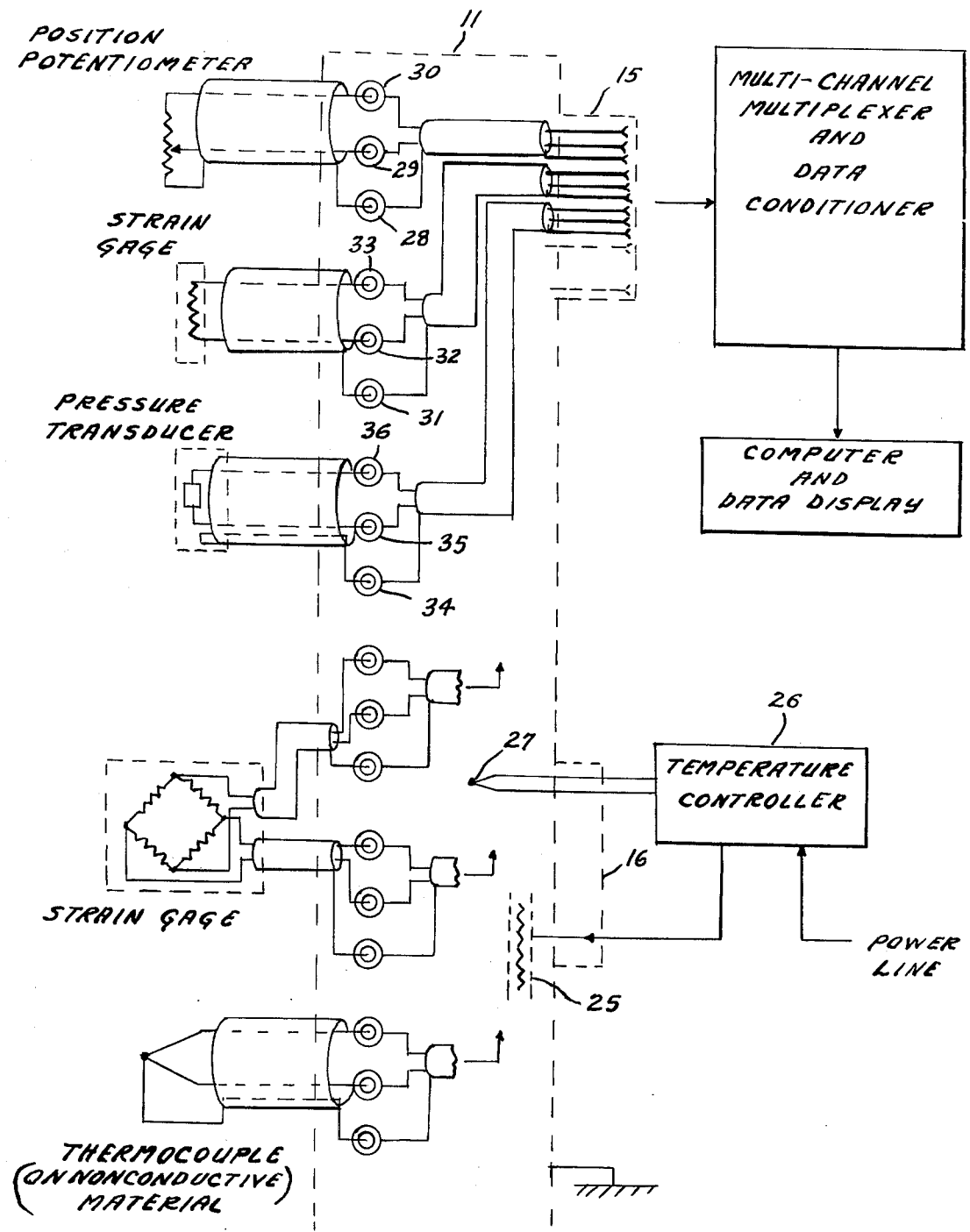
FIG. 7 is a schematic diagram showing typical sensors and connections from these sensors, in a representative temperature controlled junction box, to external data handling equipment.

The specific embodiment being described is constructed to accommodate twenty sensor circuits, each circuit having two signal conductors and a ground or shield conductor. As previously mentioned each signal lead and the ground lead are made through a respective reference junction. The ideal physical arrangement of the junctions are in groups of three as illustrated in FIGS. 1, 3, and 7. The output leads from the junctions to the cable connector socket 15 are conventional two-signal conductor shielded leads with a shield drain lead. The overall size of a typical 20-circuit junction box as being described is approximately, 4 inches high, 8½ inches long exclusive of the cover latches, and 4½ inches wide exclusive of the cable connectors. It can thus be seen that the device may be made very compact and well suited for positioning in a crowded environment.

FIGS. 2, 4, 5, and 6 show the details of the construction of the individual junctions. Bearing in mind that good shielding, good junction contacts with uniformity of contact with junction changes, and good uniform equal temperature at all junctions are features of the device, the sixty copper slugs such as 51 forming the junction blocks, are preferably fabricated from oxygen-free hard copper. Oxygen-free, hardened copper for the junction blocks reduces scoring, marking, and oxidation of the junction surfaces due to repeated use. This enhances the formation of good mechanical and electrical junctions and extends the useful life of the device as compared to junctions which use alauminum or soft copper. The use of copper also results in an electrostatically shielded, true universal junction between all sensor lead wires and the conventional copper conductors going to the utilization equipment. Thus, from the copper slug junction block to the remotely located utilization equipment conventional copper wire conductors are used. This is much to be prepared over the prior art systems that have interposed intervening junctions such as copper-aluminum, copper-nickel, nickel-aluminum, platinum-aluminum, and other dissimilar metals between the sensor and the utilization equipment. In this particular embodiment the copper slugs 51 each have a tapered hole 52 bored on centerline to a depth of approximately ⅞ inch with a 60° countersink 53 at the lip. An American Standard 3/0 taper for the bore 52 provides suitable mating with the taper pins so that both electrical contact and mechanical clamping of the lead wires occur. The copper slugs are embedded in a beryllia (beryllium oxide) block 54. Holes are molded in the beryllia block to receive by a slight shrink or press fit the copper slugs. Material of 99.5% BeO has a thermal conductivity at 150° F of greater than 0.45 g-cal/(sec) (cm$^2$)(°C/cm) and an electrical volume resistivity of greater than $10^{15}$ ohm-cm$^2$/cm. Beryllium oxide has excellent thermal characteristics and provides very good electrical insulation between the copper slug junction blocks. These characteristics eliminate the need of supplying electrical insulation between the copper slugs and the thermal conductor (beryllia in this case) if that conductor were some material such as aluminum or copper which has high electrical conductivity as well as thermal conductivity. In this particular embodiment the holes molded in the BeO block to receive the copper slugs are approximately 0.350 inches in diameter and approximately ¾ inch in depth.

Figure 5:
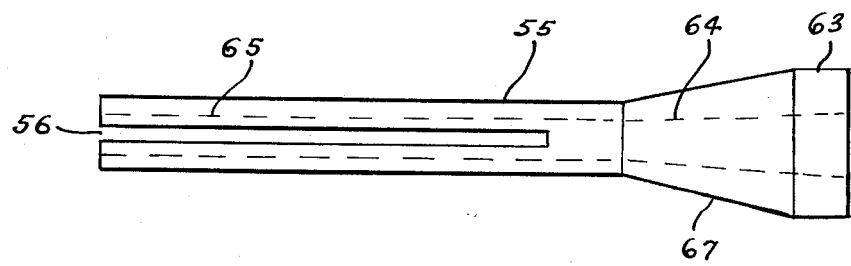
FIG. 5 is a pictorial representation of a typical plastic taper pin.
Figure 5A:
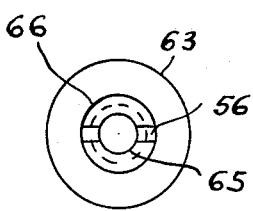
FIG. 5a is a left end view of the taper pin shown in FIG. 5.
Figure 5B:
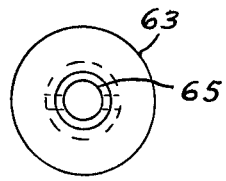
FIG. 5b is a right end view of the taper pin shown in FIG. 5.
Figure 6:
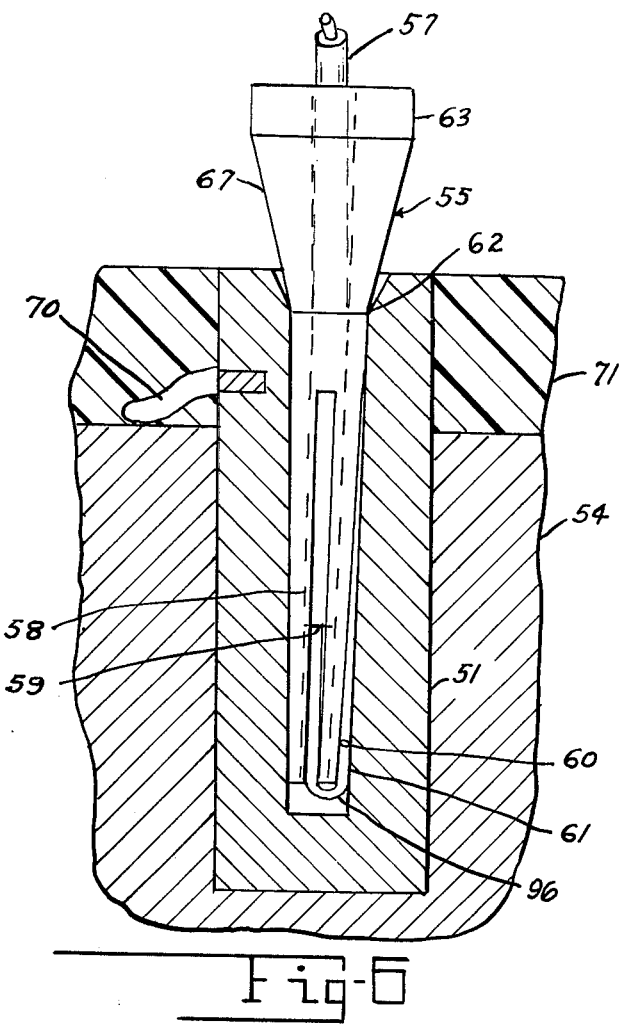
FIG. 6 is a pictorial view showing a typical taper pin carrying a sensor lead wire inserted into a copper slug.

The taper pins 55 are shown in detail in FIG. 5 and as in place in the copper slugs in FIG. 6, and in position in the completed device in FIGS. 1, 2, and 3. The commonly called "taper" pins 55 are actually not fabricated with a taper but are fabricated with a longitudinal transverse slot 56 so that they will readily deform to fit a tapered hole. The taper pins are preferably fabricated from a plastic material such as nylon which will provide sufficient friction for holding them in the tapered holes and have suitable resistance to wear encountered from repeated usage. The taper pins not only clamp the bare end of the lead wire 96 from the sensor into good electrical contact with the copper slug 51 but also clamp the insulation 57 of the lead wire by the wedging action at the general area 58. The insulation is stripped from the wire from approximately the point 59 to the end of the wire 60. This multiple clamping action on the lead provides excellent mechanical support and greatly decrease the breakage of the lead wires. This unique design also provides for the actual electrical junctions 61 between the sensor lead wire and the copper slug to be uniformly made in all the junctions at substantially the same depth location in the copper slug junction blocks when the pins are inserted into the slugs until the bottom of the taper at the top of pin seats 62 at the bottom of the countersink of the copper slug. The relatively large head 63 and the taper 67 at the top of the pin provides easy removal and insertion of the pin into the bore of the slug. The countersink 53 at the top of slugs also provides easy insertion of the pins. Also a slight taper 64 in the lead wire hole of the pin also facilitates easy insertion of the lead wire and its insulation into the pin. The cylindrical hole 65 through the pin should be compatible with the outside diameter of the insulation of the sensor lead wire so as to provide proper clamping action. Generally, two sizes will cover most sensor lead applications. A 0.031 diameter (No. 68 drill) for lead wire from No. 28 to No. 32 guage, and 0.059 diameter (No. 53 drill) for wires from No. 22 to No. 24 guage has been found suitable. The widths of the slot 56 for the small wire sizes is preferably approximately 0.010 inch, and for the larger wire sizes approximately 0.020 inch. The diameter of the cylindrical portion of the pins in this particular embodiment is approximately 0.110 inch and the overall length of a typical taper pin is approximately 1.1 inch.

Figure 4:
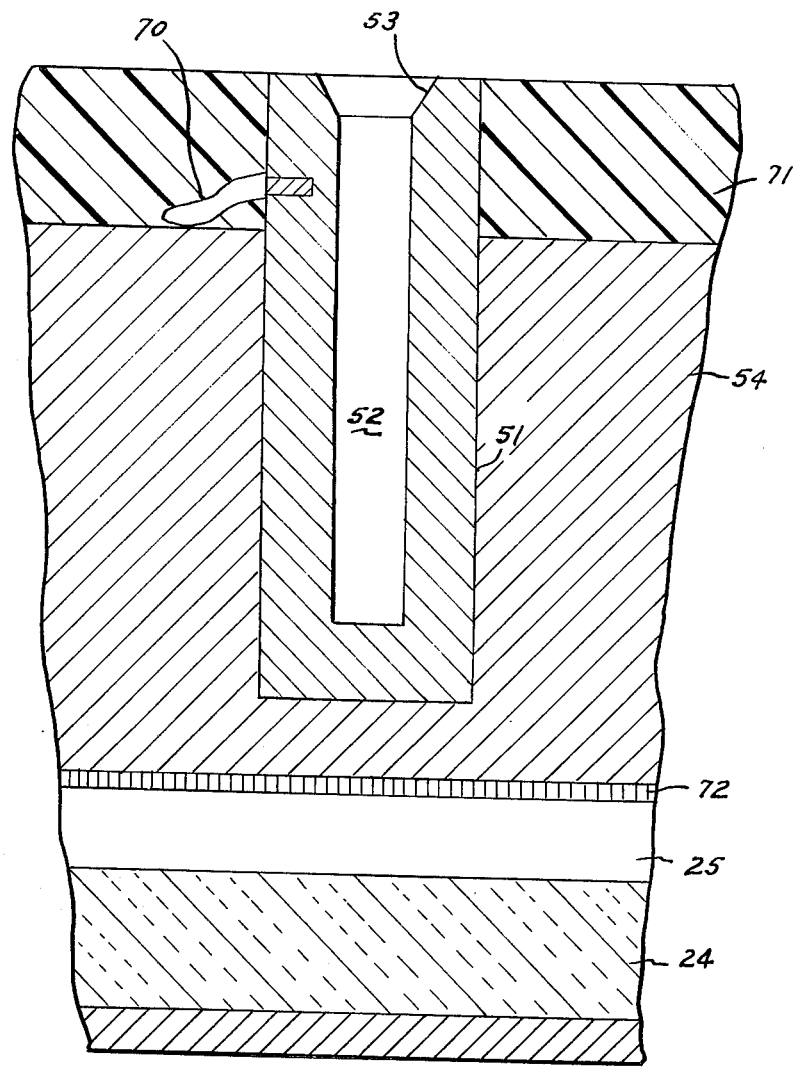
FIG. 4 is an enlarged section view showing a typical positioning of a copper shielding and contact slug in a temperature controlled environment.

A unique and very desirable feature of construction is that of bringing the output lead 70 from the junction at the top of the copper slug as shown in FIGS. 4 and 6. This is much preferred to bringing the lead from the bottom of the slug in that the elimination of leads at the bottom or lower portion of the slug allows the controlled temperature heat source 25 to be located close to the junction and without extraneous heat conducting away elements in the vacinity of the junction. As previously mentioned, the junctions are preferably arranged in groups of three, two signal leads and a ground lead. (If a particular sensor being used does not carry a ground lead, obviously, the normal ground lead junction block in that group is not used.) The signal leads 70 going from the junction block to the output plus 15 are made by conventional cable. Typical cables have two signal carrying copper conductors and a copper shield drain lead inside a foil shield. The output leads are covered with a layer of conventional resin base potting material 71 extending approximately to the top of the copper slugs 51. The shield for each pair of signal leads both going to and from the junction should be carried to close proximity to the associated signal junction slugs as normal engineering practice to prevent any coupling between circuits. Typical wiring practice is to connect the shield drain lead to the foil shield of each section of cable at only one end of the cable to prevent ground loops. The signal leads and the shield leads as represented by lead 70 in FIGS. 4 and 6 are hard soldered in a hole in the side of the copper slugs located approximately 3/16 inch below the top edge. The output leads from the junctions are conventionally bundled and routed to the output cable connector 15 and conventionally fastened to connector pins in the plug. After the output cables are installed, the top of the beryllium oxide block 54 is covered to approximately the top of the copper slugs (approximately 1/4 inch), with conventional resin base potting material 71 extending over the entire face of the block.

For the particular embodiment being described, used at room temperature down to approximately 40° F, a heating element 25 and a temperature controller 26 that can supply approximately 65 watts of heat to the structure has been found suitable. It has been found that a coating 72 of conventional heat conducting silicone grease on the bottom of the beryllium oxide block 54 making contact with the heating element 25 is very desirable in providing a uniform distribution of heat from the heater to the beryllium oxide block so that a uniform temperature exists at all the junctions.

Figure 8:
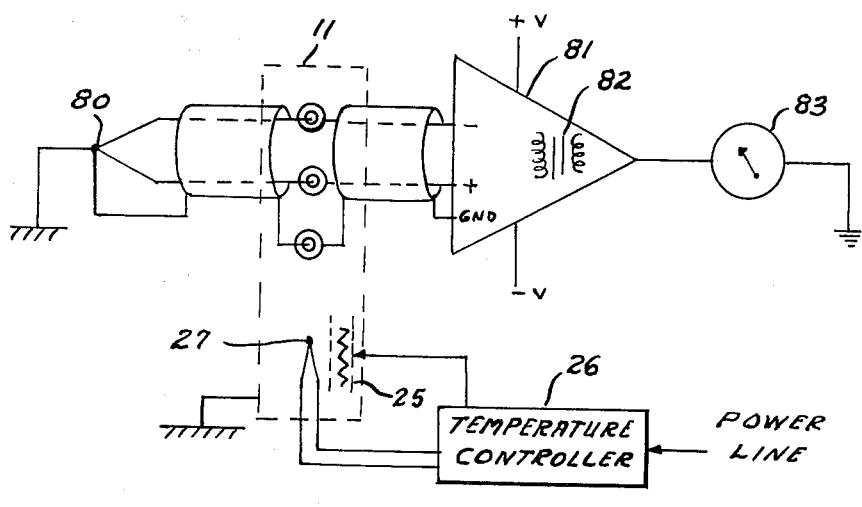
FIG. 8 shows in schematic form a grounded thermocouple sensor connected through connections in a temperature controlled junction box to an amplifier having an isolation output to a temperature reading meter.

FIG. 7 is a schematic diagram illustrative of a partial overall physical sensing system in which the invention may be incorporated. As previously stated the junction box comprising the invention is universal in usage in that generally all sensor circuits feed through the box. In the illustration shown in FIG. 7 the sensors shown are substantially of the direct current type. It is to be understood, however, that the disclosed junction device is not limited to direct current sensors but that it is also suitable for alternating current sensors and sensors of much greater complexity than those diagrammed. If a greater or a lesser number than the described 20 sensors are needed a smaller or larger box may readily be constructed according to the teaching herein contained. Also, a plurality of boxes may be used for a single test setup. Conventional good engineering practice must be used in regard to preventing electrical coupling between different circuits and the prevention of the formation of any "ground loops" in the circuits. In the latter respect, FIG. 8 is presented showing a typical placement of a thermocouple 80 on a metallic body that is at electrical ground potential. Thus, the thermocouple is grounded at its junction. The single ground, that at the thermocouple, must be the only ground in the sensing circuit. The case 11 of the universal junction is grounded by being mechanically secured to the metallic structure of the facility in which it is used. It is to be noted that none of the junctions, shields, or ground conducting leads within the box are grounded to the case. (If they were, a ground loop would appear.) The amplifier 81 contains electrical isolation 82 between its input circuit and the output circuit containing a temperature indicator 83 in a grounded circuit. In the schematic diagram of FIG. 8 the shield drain lead (a third conductor in the cable) in the input and output cables, is not shown (as is frequently common practice). It is understood that the cable shield, whether it be metallic braid or foil (i.e., a conductive coating deposited on a plastic sleeve), is connected with the drain conductor at one end of the cable its shielding. An insulating covering, also not shown, conventionally covers all cables to provide mechanical protection and electrical insulation between the shields when the cables contact each other.

I claim:

1. A reference junction device for electrically connecting a plurality of conductor leads from monitoring sensors to electrical cable connected to remotely located indicating and utilization equipment, the said junction device comprising:
   a. a ferrous metallic enclosure providing environmental protection and electrical shielding;
   b. a beryllium oxide block positioned in the said enclosure, the said block having a plurality of molded recesses in numerically at least a one-to-one ratio of correspondence with the said plurality of conductor leads;
   c. a plurality, numerically equal to the said plurality of recesses, of oxygen-free hardened copper slugs each having an upper end and a lower end with a tapered recess positioned in the upper end of each of the said slugs and the lower end of each of the said slugs positioned in a respective recess in the beryllium oxide block;
   d. a plurality of slotted plastic taper pins in numerically one-to-one ratio of correspondence with the said plurality of conductor leads, each of the said taper pins located in a respective recess of a copper slug in removable relationship, and each of the said taper pins having a bore receiving a said conductor lead and providing mechanical support to the said conductor lead;
   e. means including a taper pin for forming an electrical junction between each of the said conductor leads and its respective copper slug at substantially an equal depth in each of the said copper slugs;
   f. means for providing a uniform and substantially equal temperature of each of the said junctions;
   g. means for providing an electrical output connection near the upper end of each of said slugs; and
   h. means cooperating with each of the said slug output connections and the said electrical cable for electrically connecting the said slug to the said cable.

2. The reference junction device as claimed in claim 1 wherein the said beryllium oxide block has an upper and a lower surface with the said recesses positioned in the upper surface and the said means for providing a uniform and substantially equal temperature of each of the said junctions includes an electrical heating element positioned in silicone grease adjacent the said bottom surface of the said berryllium oxide block and a thermistor temperature sensing element positioned substantially at the center of the said beryllium oxide block.

* * * * *